US012531209B2

(12) United States Patent
Kim

(10) Patent No.: US 12,531,209 B2
(45) Date of Patent: Jan. 20, 2026

(54) PLASMA CHAMBER HAVING SWIRL MOTION SIDE GAS FEED

(71) Applicant: NYSE Star Corp., Wilmington, DE (US)

(72) Inventor: Nam Hun Kim, Yeoju-si (KR)

(73) Assignee: NYSE Star Corp., Wilmington, DE (US)

( * ) Notice: Subject to any disclaimer, the term of this patent is extended or adjusted under 35 U.S.C. 154(b) by 58 days.

(21) Appl. No.: 18/701,609

(22) PCT Filed: Sep. 16, 2022

(86) PCT No.: PCT/KR2022/013908

§ 371 (c)(1),
(2) Date: Apr. 15, 2024

(87) PCT Pub. No.: WO2023/249164

PCT Pub. Date: Dec. 28, 2023

(65) Prior Publication Data

US 2024/0420925 A1 Dec. 19, 2024

(30) Foreign Application Priority Data

Jun. 22, 2022 (KR) ........................ 10-2022-0076382

(51) Int. Cl.
*H01J 37/32* (2006.01)

(52) U.S. Cl.
CPC .................... *H01J 37/3244* (2013.01); *H01J 2237/3341* (2013.01)

(58) Field of Classification Search
CPC ...................... H01J 37/3244; H01J 2237/3341
See application file for complete search history.

(56) References Cited

U.S. PATENT DOCUMENTS 11,605,529 B2 * 3/2023 Kim .................. H01J 37/32715
2003/0070620 A1 * 4/2003 Cooperberg ........ H01J 37/3244
118/723 AN (Continued)

FOREIGN PATENT DOCUMENTS

EP 0958401 B1 9/2004
JP 2025522243 A * 7/2025

(Continued)

OTHER PUBLICATIONS

International Search Report for PCT/KR2022/013908 mailed Mar. 20, 2023 from Korean Intellectual Property Office.

*Primary Examiner* — Adam D Houston
(74) *Attorney, Agent, or Firm* — Revolution IP, PLLC

(57) ABSTRACT

A plasma chamber includes: a housing having a seating part on which a wafer is seated; a first swirl motion side gas feed that is provided on the side surface of the housing and injects gas into the housing; and a second swirl motion side gas feed that is provided on the side surface of the housing and injects gas into the housing, wherein the first swirl motion side gas feed and the second swirl motion side gas feed inject gas along the wall surface of the housing, the first swirl motion side gas feed injects gas on a plane extending in a direction parallel to a plane formed by the seating part, and the second swirl motion side gas feed injects gas while forming an angle with respect to the plane extending in the direction parallel to the plane formed by the seating part.

15 Claims, 3 Drawing Sheets

(56) References Cited

U.S. PATENT DOCUMENTS

| | | | | |
|---|---|---|---|---|
| 2005/0173069 | A1 | 8/2005 | Tolmachev et al. | |
| 2006/0130756 | A1* | 6/2006 | Liang | C23C 16/507 118/715 |
| 2007/0274893 | A1* | 11/2007 | Wright | H05H 1/30 422/186.04 |
| 2016/0268104 | A1* | 9/2016 | Polak | H01J 37/32532 |
| 2019/0006154 | A1* | 1/2019 | Hu | B22D 21/007 |
| 2019/0098740 | A1* | 3/2019 | Yamazawa | H01L 21/6831 |
| 2021/0166918 | A1 | 6/2021 | Uda et al. | |
| 2022/0084794 | A1* | 3/2022 | Collins | H01J 37/32449 |
| 2023/0377848 | A1* | 11/2023 | Holman | H01J 37/32201 |
| 2024/0071725 | A1* | 2/2024 | Kozlowski | H01J 37/32192 |
| 2024/0339302 | A1* | 10/2024 | Sarode Vishwanath | H01J 37/3244 |

FOREIGN PATENT DOCUMENTS

| | | | | | |
|---|---|---|---|---|---|
| KR | 10-0484945 | B1 | | 4/2005 | |
| KR | 10-1930241 | B1 | | 12/2018 | |
| KR | 10-2021-0066722 | A | | 6/2021 | |
| KR | 20230153831 | A | * | 11/2023 | H01J 37/3244 |
| KR | 102829461 | B1 | * | 7/2025 | H01J 37/321 |
| WO | WO-0041212 | A1 | * | 7/2000 | H01J 37/3244 |
| WO | WO-2005052980 | A1 | * | 6/2005 | H01J 37/3244 |
| WO | WO-2010094972 | A1 | * | 8/2010 | H05H 1/42 |
| WO | WO-2023239081 | A1 | * | 12/2023 | H01L 21/3065 |
| WO | WO-2023239845 | A1 | * | 12/2023 | H01J 37/32201 |
| WO | WO-2023249164 | A1 | * | 12/2023 | H01J 37/32449 |

* cited by examiner

PLASMA CHAMBER HAVING SWIRL MOTION SIDE GAS FEED

TECHNICAL FIELD

The present invention relates to a plasma chamber provided with a swirl motion side gas feed, and more particularly, to a plasma chamber provided with a swirl motion side gas feed, in which the design of the side gas feed, which is provided on a side surface of the chamber and sprays gas in the form of a downward swirl motion, is adjusted so that a uniform etch rate is maintained inside the chamber.

BACKGROUND ART

Generally, it is very important to ensure uniformity in a process of manufacturing a semiconductor, and the uniformity of the semiconductor may be secured or controlled during an etching process in the process of manufacturing the semiconductor.

A process of etching a semiconductor may be performed inside a plasma chamber. Plasma is formed in a reaction space inside the plasma chamber, and the etching process for a semiconductor is performed using the plasma.

A plasma source for forming plasma is provided in an upper portion of a plasma chamber, and representative examples of the plasma source include a capacitively coupled plasma (CCP) source, an inductively coupled plasma (ICP) source, etc.

In an etching process, gas distribution inside a plasma chamber may be an important factor in maintaining a uniform etch rate. Generally, in order to maintain a uniform etch rate, a shower head design is used in a chamber using a CCP source, and a bottom gas feed (BGF), a center gas feed (CGF), or a side gas feed (SGF) is used in a chamber using an ICP source.

Although ICP may increase an etch rate compared to CCP, the ICP has a problem of low selectivity and low process repeatability.

Further, when gas to be sprayed into a plasma chamber with ICP consists of heavy molecules, there is a problem in that it is difficult to maintain a uniform etch rate through a CGF. Specifically, when the CGF is used, a velocity of the gas moving in a z-direction (lower direction of the chamber) increases due to the heavy molecules, and thus the etch rate can be improved, but there is a problem in that the uniformity of the etch rate is degraded.

DISCLOSURE

Technical Problem

The present invention is directed to providing a plasma chamber provided with a swirl motion side gas feed, in which the design of the side gas feed, which is provided on a side surface of the chamber and sprays gas in the form of a downward swirl motion, is adjusted so that a uniform etch rate is maintained inside the chamber.

Technical Solution

One aspect of the present invention provides a plasma chamber provided with a swirl motion side gas feed, which is a plasma chamber in which plasma is formed to etch a wafer, the plasma chamber including: a housing having a seating part on which the wafer is seated; a first swirl motion side gas feed provided on a side surface of the housing and configured to spray gas into the housing; a second swirl motion side gas feed provided on the side surface of the housing and configured to spray gas into the housing, wherein the first swirl motion side gas feed and the second swirl motion side gas feed spray gas along a wall surface of the housing, the first swirl motion side gas feed sprays a gas along a plane extending in a direction parallel to a plane formed by the seating part, and the second swirl motion side gas feed sprays a gas at an angle formed with respect to the plane extending in the direction parallel to the plane formed by the seating part.

The gases sprayed from the first swirl motion side gas feed and the second swirl motion side gas feed may form a downward swirl motion and may be sprayed onto the wafer within the housing.

The plane extending in the direction parallel to the plane formed by the seating part may be formed at a position at where the second swirl motion side gas feed is provided on the housing, and a velocity $v_o$ of the gas sprayed from the second swirl motion side gas feed may be $v_o=(0, v_\theta, v_z)$ ($v_z \neq 0$) with respect to a cylindrical coordinate system (r, θ, z) whose origin is a point at which the plane and a center line of the housing meet.

The plane extending in the direction parallel to the plane formed by the seating part may be formed at a position where the first swirl motion side gas feed is provided on the housing, and a velocity $v_o$ of the gas sprayed from the first swirl motion side gas feed may be $v_o=(0, v_\theta, 0)$ with respect to the cylindrical coordinate system (r, θ, z) whose origin is a point at which the plane and the center line of the housing meet.

The gases sprayed from the first swirl motion side gas feed and the second swirl motion side gas feed may include at least any one of fluorocarbon ($C_xF_y$)-based gas, fluorohydrocarbon ($C_xH_yF_z$)-based gas, $SF_6$, $C_3F_6O$, Ar, $O_2$, and $N_2$.

The gas sprayed from the second swirl motion side gas feed may include gas having a heavier molecular weight than the gas sprayed from the first swirl motion side gas feed.

A position where the second swirl motion side gas feed is installed on the housing may be higher than a position where the first swirl motion side gas feed is installed on the housing.

The gas sprayed from the second swirl motion side gas feed may include at least any one of $C_4F_8$, $C_4F_6$, $C_3F_8$, $C_3F_6$, $C_2F_6$, $SF_6$, and $C_3F_6O$, and the gas sprayed from the first swirl motion side gas feed may include at least any one of $CF_4$, $CHF_3$, Ar, $O_2$, and $N_2$.

The plasma chamber having the swirl motion side gas feed may further include a center gas feed provided above the housing and configured to spray gas into the housing, wherein the gases sprayed from the first swirl motion side gas feed and the second swirl motion side gas feed may include gas having a heavier molecular weight than gas sprayed from the center gas feed.

The gas sprayed from the center gas feed may include at least any one of $O_2$, $N_2$, and Ar.

The plasma chamber having the swirl motion side gas feed may further include a spray motion side gas feed configured to spray gas into the housing, wherein the spray motion side gas feed may spray a gas toward a surface of the wafer seated on the seating part or upward of the surface of the wafer.

The gas sprayed from the spray motion side gas feed may include gas having a heavier molecular weight than the gases sprayed from the first swirl motion side gas feed and the second swirl motion side gas feed.

The gas sprayed from the spray motion side gas feed may include at least any one of Ar, $O_2$, and $N_2$.

The first swirl motion side gas feed may be provided as a plurality of first swirl motion side gas feeds on the housing, the second swirl motion side gas feed may be provided as a plurality of second swirl motion side gas feeds on the housing, three or more of the plurality of first swirl motion side gas feeds provided on the housing may be provided at the same height from the seating part, and three or more of the plurality of second swirl motion side gas feeds provided on the housing may be provided at the same height from the seating part.

The plasma formed in an internal space of the housing may include ions and radicals, and the wafer may be etched by a synergistic effect of the ions and the radicals.

Advantageous Effects

The present invention relates to a plasma chamber provided with a swirl motion side gas feed, and has an advantage in that the design of the side gas feed, which is provided on a side surface of the chamber and sprays gas in the form of a downward swirl motion, is adjusted so that a uniform etch rate can be maintained inside the chamber.

Further, the present invention has an advantage in that a first swirl motion side gas feed that sprays gas along a plane extending in a direction parallel to a plane formed by a seating part, and a second swirl motion side gas feed that sprays gas at an angle formed with respect to the plane extending in the direction parallel to the plane formed by the seating part can be used, and thus an etch rate can be improved and the uniformity of the etch rate can be improved.

In addition, the present invention has an advantage in that, since heavy molecular gas can be sprayed through the side gas feeds by simultaneously using a first swirl motion side gas feed, a second swirl motion side gas feed, a spray motion side gas feed, and a center gas feed, an etch rate can be improved and the uniformity of the etch rate can be improved.

MODES OF THE INVENTION

Figure 1:
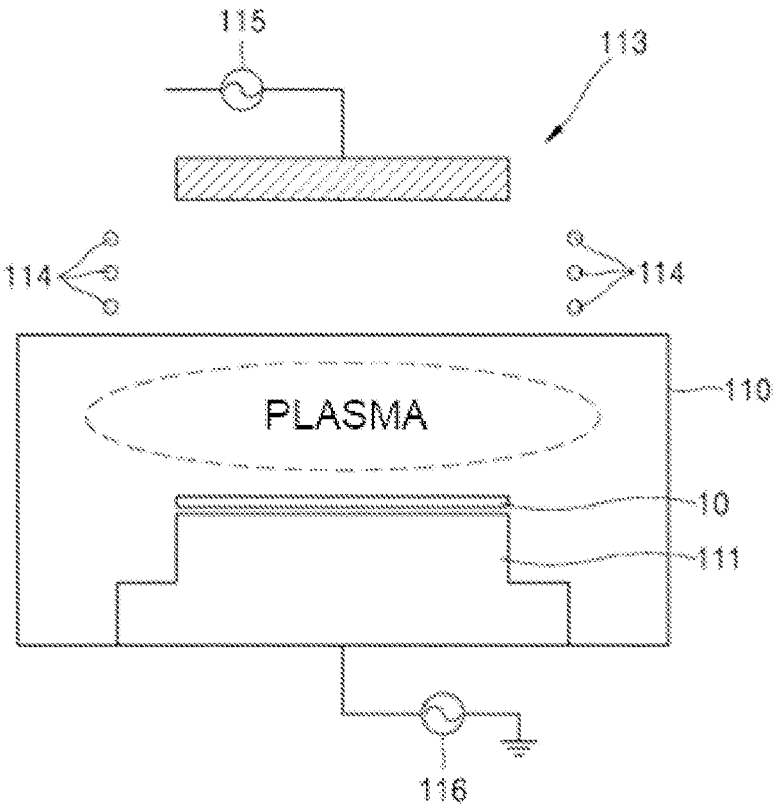
FIG. 1 is a diagram illustrating a plasma chamber according to an embodiment of the present invention.

This specification clarifies the scope of the present invention, explains the principles of the present invention so that those skilled in the art can implement the present invention, and discloses embodiments. The disclosed embodiments may be implemented in various forms.

Expressions such as "include" and "may include" that may be used in various embodiments of the present invention refer to the presence of a corresponding function, operation, or component that has been disclosed, and do not limit one or more additional functions, operations, or components. Further, in various embodiments of the present invention, it should be further understood that the terms "comprise," "comprising," "include," and/or "including" are intended to specify the presence of stated features, integers, steps, operations, components, parts, or combinations thereof described in the specification, but do not preclude the presence or addition of one or more other features, integers, steps, operations, components, parts, or combinations thereof.

It should be understood that when a first element is referred to as being "connected" or "coupled" to a second element, the first element may be directly connected or coupled to the second element or a third element may be present between the first element and the second element. In contrast, it should be understood that, when a first element is referred to as being "directly connected" or "directly coupled" to a second element, no element is present between the first element and the second element.

It should be understood that, although the terms "first," "second," and the like may be used herein to describe various elements, the elements are not limited by these terms. The terms are only used to distinguish one element from another element.

The present invention relates to a plasma chamber provided with a swirl motion side gas feed, and more particularly, to a plasma chamber provided with a swirl motion side gas feed, in which the design of the side gas feed, which is provided on a side surface of the chamber and sprays gas in the form of a downward swirl motion, is adjusted so that a uniform etch rate is maintained inside the chamber.

In a plasma chamber in which a wafer is etched, variables that affect an etching process include an etchant, diluent, oxygen, pressure, source power, and bias power.

Etching for most oxides uses an ion-dominated reaction, and thus temperature may not have a significant effect on the etching process. Here, the variable that has the greatest influence on an etch rate may be bias power, followed by pressure. Further, etching gas is also a factor that affect the etch rate.

In the etching process, when the etching gas is sprayed perpendicularly to a plane formed by a seating part on which the wafer is seated (incidence angle is 0 degrees), sputtering is strong and the etch rate is the highest. Conversely, when the etching gas is sprayed from the side in a direction parallel to the plane formed by the seating part on which the wafer is seated (incidence angle is 90 degrees), the etching gas barely contributes to etching.

A center gas feed (CGF), which is provided in an upper portion of the chamber and sprays gas, has an incidence angle close to 0 degrees, and a side gas feed (SGF), which is provided on a side surface of the chamber and sprays gas toward a surface of the wafer, may have an incidence angle of 30 to 60 degrees.

Here, when the SGF sprays the gas in a direction parallel to a wall surface of the chamber and the gas in the form of a swirl motion reaches the wafer, the incidence angle increases so that the etch rate decreases, but the uniformity of the etch rate can be improved.

In a plasma chamber provided with a swirl motion SGF according to an embodiment of the present invention, the design of the SGF that sprays gas in the form of a downward swirl motion may be adjusted so that a uniform etch rate can be maintained inside the chamber. Hereinafter, exemplary embodiments of the present invention will be described in detail with reference to the accompanying drawings.

The plasma chamber having the swirl motion SGF according to the embodiment of the present invention includes a housing 110, a first swirl motion SGF 120, and a second swirl motion SGF 130.

Referring to FIG. 1, the housing 110 has a reaction space therein in order to etch a wafer 10 through plasma. The housing 110 may be an outer wall of the plasma chamber according to the embodiment of the present invention, and has a space therein.

A seating part 111 on which the wafer 10 is seated may be provided in the housing 110, and the wafer 10 may be loaded onto the seating part 111. When the wafer 10 is loaded into the housing 110, the wafer 10 may be etched by plasma formed inside the housing 110.

The seating part 111 may be a plate which is provided inside the housing 110 and on which the wafer 10 is seated, or the seating part 111 may be a wafer chuck on which the wafer 10 to be seated and which supports the wafer 10.

According to an embodiment of the present invention, a plasma source 113 that forms plasma may be provided above the housing 110. Referring to FIG. 1, the plasma source 113 may include coils 114 and a radio frequency (RF) power generator 115, and plasma may be formed inside the housing 110 using the coils 114 and the RF power generator 115. Of course, in order to maximize RF power transfer, a matching box may be installed between the RF power generator 115 and plasma coils.

The plasma chamber having the swirl motion SGF according to the embodiment of the present invention may further include a bias RF source 116 that can apply a bias to the seating part 111. Referring to FIG. 1, the bias RF source 116 may apply a bias to the seating part 111 to apply a bias to the plasma during the etching process. Of course, a bias matching box may also be installed in the bias RF source 116 for efficient power transfer.

The plasma chamber having the swirl motion SGF according to the embodiment of the present invention may solve problems in the conventional methods using an inductively coupled plasma (ICP) source and may be improved from the conventional methods.

Further, the plasma chamber having the swirl motion SGF according to the embodiment of the present invention may be synergistic resonance ICP (SRICP) that uses resonance and a synergistic effect.

Specifically, the plasma formed in the space inside the housing 110 of the plasma chamber having the swirl motion SGF according to the embodiment of the present invention may include ions and radicals, and the wafer 10 may be etched by a synergistic effect of the ions and the radicals.

Plasma is largely composed of electrons, ions, and radicals. Referring to the conventional method of etching a wafer through plasma, the dominant species is formed as either ions or radicals during the plasma etching process. Specifically, in the conventional method of etching the wafer through the plasma, the radicals are mainly used in metal etching, and the ions are mainly used in oxide etching.

In the plasma chamber having the swirl motion SGF according to the embodiment of the present invention, during the plasma etching process, the dominant species is not formed by either ions or radicals, but may be formed using ions and radicals simultaneously. However, the present invention is not limited thereto, and the plasma chamber having the swirl motion SGF according to the embodiment of the present invention may be applied even when only either ions or radicals are used, and even in this case, the uniformity of the etch rate can be improved.

In the plasma chamber having the swirl motion SGF according to the embodiment of the present invention, a process area in which ions and radicals act together to produce a synergistic effect rather than performing an ion-dominated or radical-dominated reaction during the etching process is used.

More specifically, in the plasma chamber having the swirl motion SGF according to the embodiment of the present invention, the ions and the radicals are all used, and thus selectivity can be improved while maintaining a high etch rate through the resonance and synergistic effect between the ions and the radicals.

Figure 2:
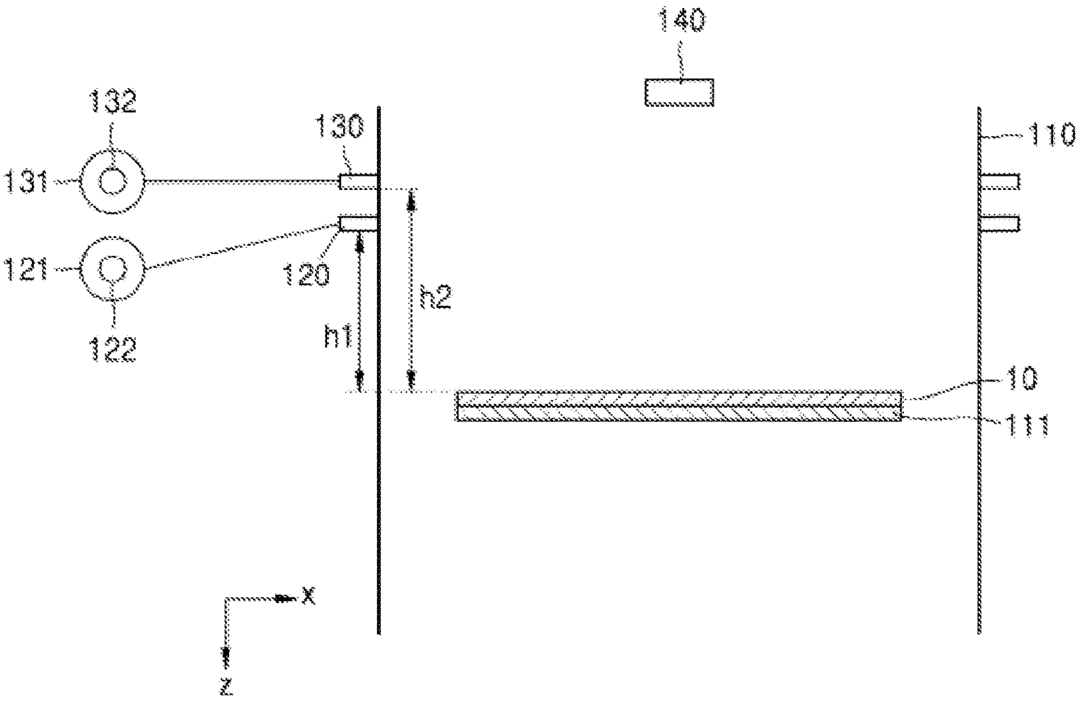
FIG. 2 is a diagram illustrating a housing on which a first swirl motion side gas feed, a second swirl motion side gas feed, and a center gas feed are provided according to an embodiment of the present invention.

Referring to FIG. 2, the first swirl motion SGF 120 may be provided on a side surface of the housing 110 and sprays gas into an interior of the housing 110. The second swirl motion SGF 130 may be provided on the side surface of the housing 110 and sprays gas into the housing 110.

Figure 3:
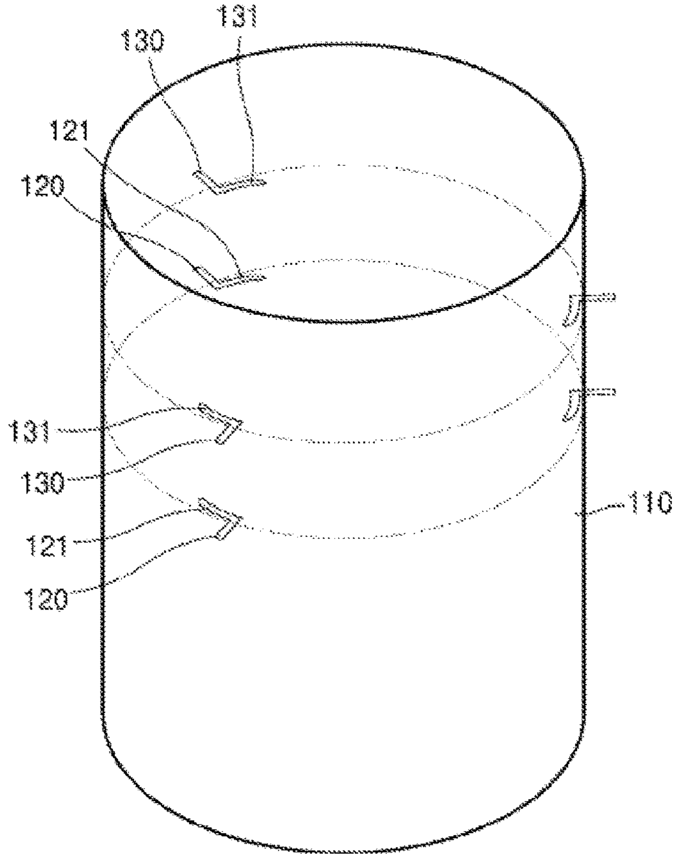
FIG. 3 is a diagram illustrating a housing on which a plurality of first swirl motion side gas feeds and a plurality of second swirl motion side gas feeds are installed according to an embodiment of the present invention.

Referring to FIGS. 2 and 3, the housing 110 may include a plurality of first swirl motion SGFs 120, each first swirl motion SGF 120 may include a first nozzle 121 including a first nozzle hole 122 through which gas is sprayed, and the housing 110 may include a plurality of first nozzles 121.

Referring to FIGS. 2 and 3, the housing 110 may include a plurality of second swirl motion SGFs 130, each second swirl motion SGF 130 may include a second nozzle 131 including a second nozzle hole 132 through which gas is sprayed, and the housing 110 may include a plurality of second nozzles 131.

According to an embodiment of the present invention, the first swirl motion SGFs 120 and the second swirl motion SGFs 130 may spray gas along a wall surface of the housing 110.

When the first swirl motion SGFs 120 and the second swirl motion SGFs 130 spray the gas along the wall surface of the housing 110, the gas sprayed from the first swirl motion SGFs 120 and the second swirl motion SGFs 130 may form a downward swirl motion and may be sprayed onto the wafer 10 within the housing 110.

When the gas sprayed from the first swirl motion SGFs 120 and the second swirl motion SGFs 130 forms a downward swirl motion and comes into contact with the wafer 10, the gas moves additionally due to centrifugal force even when the gas comes into contact with the wafer 10, resulting in a diffusion effect. Due to such a diffusion effect, the gas reacts with nearby particles, and thus the uniformity of the etch rate can be improved.

Figure 4:
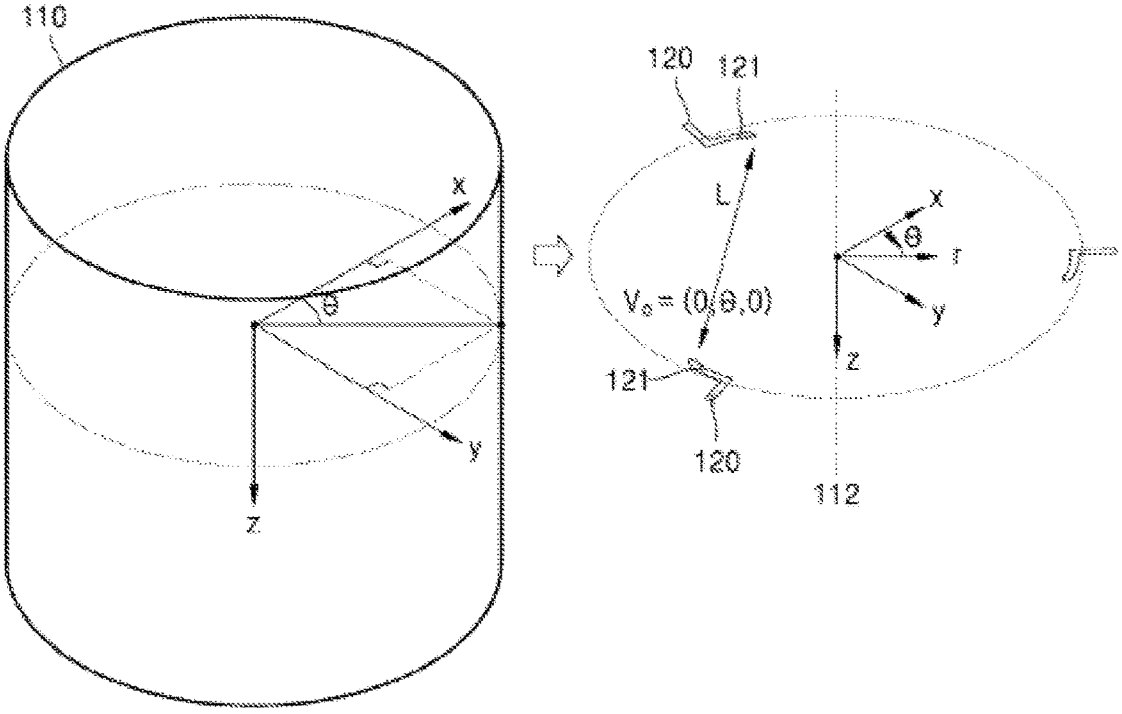
FIG. 4 is a diagram illustrating the fact that a velocity (vector) direction of gas sprayed from a first swirl motion side gas feed is $v_o=(0, v_\theta, 0)$ with respect to a cylindrical coordinate system (r, θ, z) according to an embodiment of the present invention.

Referring to FIG. 4, when the first swirl motion SGFs 120 spray the gas along the wall surface of the housing 110, the first swirl motion SGFs 120 may spray the gas along a plane extending in a direction parallel to the plane formed by the seating part 111.

Specifically, the first nozzles 121 of the first swirl motion SGFs 120 extend along the side surface of the housing 110, and thus the gas sprayed from the first swirl motion SGFs 120 is sprayed along the wall surface of the housing 110.

Referring to FIG. 4, a velocity (velocity vector) $v_o$ of the gas sprayed from the first swirl motion SGF 120 may be $v_o=(0, v_\theta, 0)$ with respect to a cylindrical coordinate system (r, 0, z) relative to a position where the first swirl motion SGF 120 is provided on the housing 110.

More specifically, the plane extending in the direction parallel to the plane formed by the seating part 111 is formed at the position where the first swirl motion SGF 120 is provided on the housing 110, and when the cylindrical coordinate system (r, θ, z) is defined using a point at which the plane and a center line 112 of the housing 110 meet as the origin, the velocity (velocity vector) $v_o$ of the gas sprayed from the first swirl motion SGF 120 may be $v_o=(0, v_\theta, 0)$.

That is, the velocity vector of the gas sprayed from the first swirl motion SGF 120 may have no r-direction component (0), and the gas may be sprayed in a θ direction. When the gas is sprayed from the first swirl motion SGF 120 in this way, the first swirl motion SGF 120 may spray the gas along the wall surface of the housing 110.

When the gas is sprayed along the wall surface of the housing 110 through the first swirl motion SGF 120, the gas sprayed from the first swirl motion SGF 120 may form a downward swirl motion and may be sprayed onto the wafer 10 within the housing 110.

Figure 5:
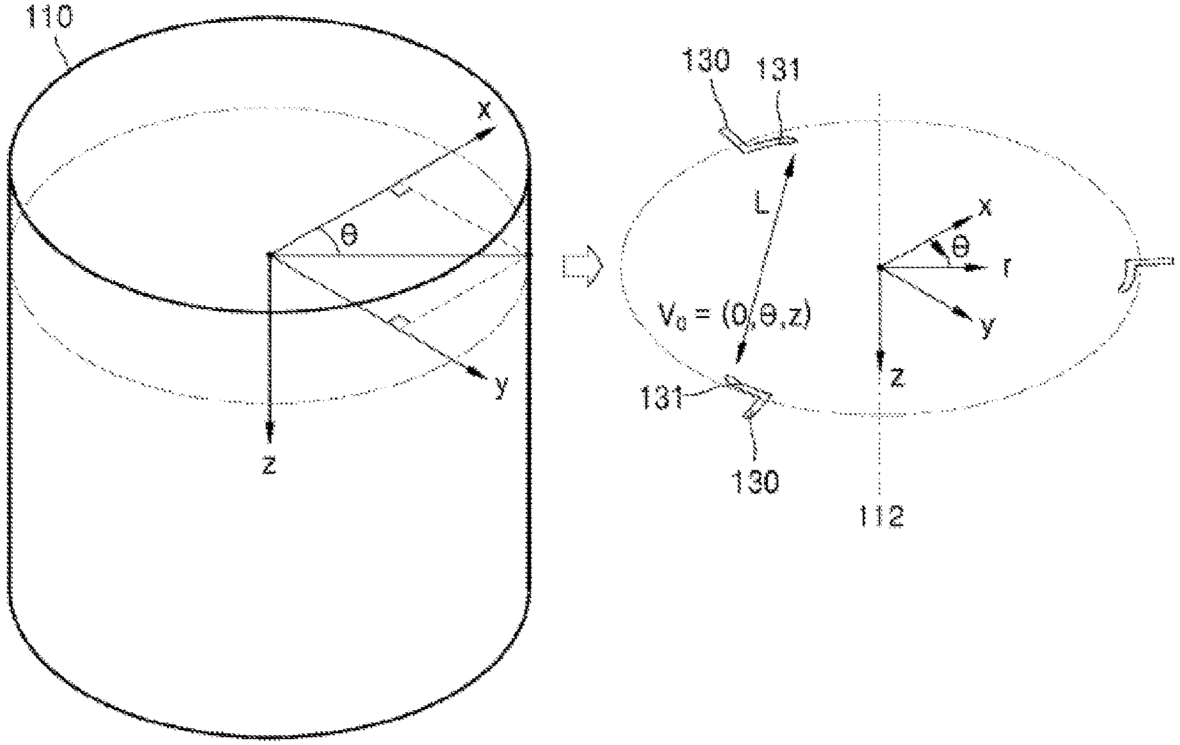
FIG. 5 is a diagram illustrating the fact that a velocity (vector) direction of gas sprayed from a second swirl motion side gas feed is $v_o=(0, v_\theta, v_z)$ with respect to a cylindrical coordinate system (r, θ, z) according to an embodiment of the present invention.

Referring to FIG. 5, when the second swirl motion SGF 130 sprays the gas along the wall surface of the housing 110, the second swirl motion SGF 130 may spray the gas at an angle formed with respect to the plane extending in the direction parallel to the plane formed by the seating part 111.

Specifically, the second nozzles 131 of the second swirl motions SGF 130 extend along the side surface of the housing 110, and the gas sprayed from the second swirl motion SGF 130 is sprayed along the wall surface of the housing 110.

Referring to FIG. 5, a velocity (velocity vector) $v_o$ of the gas sprayed from the second swirl motion SGF 130 may be $v_o=(0, v_\theta, v_z)$ with respect to a cylindrical coordinate system (r, θ, z) relative to a position where the second swirl motion SGF 130 is provided on the housing 110. (Here, $v_z>0$, $v_z<0$, or $v_z\neq0$)

More specifically, the plane extending in the direction parallel to the plane formed by the seating part 111 is formed at the position where the second swirl motion SGF 130 is provided on the housing 110, and when the cylindrical coordinate system (r, θ, z) is defined using a point at which the plane and the center line 112 of the housing 110 meet as the origin, the velocity (velocity vector) $v_o$ of the gas sprayed from the second swirl motion SGF 130 may be $v_o=(0, v_\theta, v_z)$.

That is, the velocity vector of the gas sprayed from the second swirl motion SGF 130 may have no r-direction component (0), and the gas may be sprayed in the θ direction. When the gas is sprayed from the second swirl motion SGF 130 in this way, the second swirl motion SGF 130 may spray the gas along the wall surface of the housing 110.

In the velocity vector $v_o=(0, v_\theta, v_z)$ of the gas sprayed from the second swirl motion SGF 130, $v_z$ may be greater or less than 0 ($v_z\neq0$). That is, the second swirl motion SGF 130 may spray the gas upward or downward with respect to the plane extending in the direction parallel to the plane formed by the seating part 111 at the position where the second swirl motion SGF 130 is provided on the housing 110 ($v_z>0$ or $v_z<0$).

When the gas is sprayed from the second swirl motion SGF 130 in this way, the gas sprayed from the second swirl motion SGF 130 may form a downward swirl motion and may be sprayed onto the wafer 10 within the housing 110.

According to an embodiment of the present invention, the first swirl motion SGF 120 sprays the gas along the plane extending in the direction parallel to the plane formed by the seating part 111 at the position where the first swirl motion SGF 120 is provided on the housing 110, and thus the uniformity of the etch rate can be improved.

However, when the gas is sprayed along the plane extending in the direction parallel to the plane formed by the seating part 111 at the position where the first swirl motion SGF 120 is provided on the housing 110 through the first swirl motion SGF 120, it is possible to improve the uniformity of the etch rate, but it may be difficult to effectively improve the etch rate.

In the plasma chamber having the swirl motion SGF according to the embodiment of the present invention, the first swirl motion SGF 120 and the second swirl motion SGF 130 may be used simultaneously in order to improve the etch rate while improving the uniformity of the etch rate.

According to an embodiment of the present invention, when the gas is sprayed downward with respect to the plane extending in the direction parallel to the plane formed by the seating part 111 at the position where the second swirl motion SGF 130 is provided on the housing 110 through the second swirl motion SGF 130, a downward angle may be formed, and thus the etch rate can be improved more effectively.

Referring to FIG. 3, the housing 110 may include the plurality of first swirl motion SGFs 120 and the plurality of second swirl motion SGFs 130.

According to an embodiment of the present invention, it is preferable that three or more of the plurality of first swirl motion SGFs 120 provided on the housing 110 be provided at the same height from the seating part 111. Further, it is preferable that three or more of the plurality of second swirl motion SGFs 130 provided on the housing 110 be provided at the same height from the seating part 111.

Referring to FIGS. 2 and 3, the plurality of first swirl motion SGFs 120 may be provided on the plane extending in the direction parallel to the plane formed by the seating part 111 to be spaced the same height $h_1$ from the seating part 111.

According to an embodiment of the present invention, it is preferable that three or more of the first swirl motion SGFs 120 be provided on the plane extending in the direction parallel to the plane formed by the seating part 111.

The first swirl motion SGFs 120 may spray the gas along the wall surface of the housing 110, and the gas sprayed from one first swirl motion SGF 120 receives a force from another first swirl motion SGF 120 to form a downward swirl motion.

In this case, when the number of the first swirl motion SGFs 120 provided on the plane extending in the direction parallel to the plane formed by the seating part 111 is less than three, a distance between one first swirl motion SGF 120 and another first swirl motion SGF 120 increases, and thus it is difficult to form a downward swirl motion.

Therefore, it is preferable that the number of the first swirl motion SGFs 120 provided on the plane extending in the direction parallel to the plane formed by the seating part 111 be three or more. Referring to FIG. 3, n or more first swirl motion SGFs 120 may be provided on the housing 110 ($n\geq3$).

However, the present invention is not limited thereto, and the plurality of first swirl motion SGFs 120 may be provided at different heights on the housing 110. Three or more of the plurality of first swirl motion SGFs 120 may be provided at points spaced a predetermined height from the seating part 111, and three or more of the plurality of first swirl motion SGFs 120 may be provided at points spaced another predetermined height from the seating part 111.

That is, when the plurality of first swirl motion SGFs 120 are provided on the housing 110, three or more first swirl motion SGFs 120 form one layer, and thus multiple layers may be formed.

Referring to FIGS. 2 and 3, the plurality of second swirl motion SGFs 130 may be provided on the plane extending in the direction parallel to the plane formed by the seating part 111 to be spaced the same height $h_2$ from the seating part 111.

According to an embodiment of the present invention, it is preferable that three or more second swirl motion SGFs 130 be provided on the plane extending in the direction parallel to the plane formed by the seating part 111.

The second swirl motion SGF 130 may spray the gas along the wall surface of the housing 110, and the gas sprayed from one second swirl motion SGF 130 receives force from another second swirl motion SGF 130 to form a downward swirl motion.

In this case, when the number of the second swirl motion SGFs 130 provided on the plane extending in the direction parallel to the plane formed by the seating part 111 is less than three, a distance between one second swirl motion SGF 130 and another second swirl motion SGF 130 increases, and thus it is difficult to form a downward swirl motion.

Therefore, it is preferable that the number of the second swirl motion SGFs 130 provided on the plane extending in the direction parallel to the plane formed by the seating part 111 be three or more. Referring to FIG. 3, n or more second swirl motion SGFs 130 may be provided on the housing 110 ($n \geq 3$).

However, the present invention is not limited thereto, and the plurality of second swirl motion SGFs 130 may be provided at different heights on the housing 110. Three or more of the plurality of second swirl motion SGFs 130 may be provided at points spaced a predetermined height from the seating part 111, and three or more of the plurality of second swirl motion SGFs 130 may be provided at points spaced another predetermined height from the seating part 111.

That is, when the plurality of second swirl motion SGFs 130 are provided on the housing 110, three or more second swirl motion SGFs 130 form one layer, and thus multiple layers may be formed.

The gas sprayed from the first swirl motion SGF 120 and the second swirl motion SGF 130 according to the embodiment of the present invention may include at least any one of fluorocarbon ($C_xF_y$)-based gas, fluorohydrocarbon ($C_xH_yF_z$)-based gas, $SF_6$, $C_3F_6O$, Ar, $O_2$, and $N_2$. (x, y, and z are natural numbers)

Referring to FIGS. 2 and 3, the position where the second swirl motion SGF 130 is installed on the housing 110 may be higher than the position where the first swirl motion SGF 120 is installed on the housing 110. Specifically, the second swirl motion SGF 130 may be provided on the housing 110 at a higher position than the first swirl motion SGF 120.

According to an embodiment of the present invention, the gas sprayed from the second swirl motion SGF 130 may include gas having a heavier molecular weight than the gas sprayed from the first swirl motion SGF 120.

According to an embodiment of the present invention, the gas sprayed from the second swirl motion SGF 130 may include at least any one of $C_4F_8$, $C_4F_6$, $C_3F_8$, $C_3F_6$, $C_2F_6$, $SF_6$, and $C_3F_6O$, and the gas sprayed from the first swirl motion SGF 120 may include at least any one of $CF_4$, $CHF_3$, Ar, $O_2$, and $N_2$.

In the wafer etching process, etching $SiO_2$ or etching a mask such as a photoresist (PR), an amorphous carbon layer (ACL), etc., may be performed. Here, technologies for etching $SiO_2$ or a mask such as a PR, an ACL, etc., are already well-known technologies, and thus detailed descriptions thereof will be omitted.

In this case, in order to improve selectivity, it is preferable that an etch rate of $SiO_2$ be improved and an etch rate of a mask such as a PR, an ACL, etc., be lowered. In order to increase the etch rate, it is preferable that an incidence angle formed between the gas sprayed onto the wafer 10 and the wafer 10 be small, and in order to lower the etch rate, it is preferable that the incidence angle formed between the gas sprayed onto the wafer 10 and the wafer 10 be large.

Here, when the incidence angle formed between the gas sprayed onto the wafer 10 and the wafer 10 is 0 degrees, the gas is sprayed vertically and comes into contact with the wafer 10. When the incidence angle formed between the gas sprayed onto the wafer 10 and the wafer 10 is 90 degrees, the gas may come into contact with the wafer 10 in a direction parallel to the plane formed by the wafer 10.

Since the first swirl motion SGF 120 sprays the gas along the plane extending in the direction parallel to the plane formed by the seating part 111 (z-direction component is 0), the incidence angle increases so that the gas may come into contact with the wafer 10. Since the second swirl motion SGF 130 sprays the gas at a downward angle that is an angle formed with respect to the plane extending in the direction parallel to the plane formed by the seating part 111 ($v_z<0$), the incidence angle thereof becomes smaller than that of the gas sprayed from the first swirl motion SGF 120 so that the gas may come into contact with the wafer 10.

In order to improve the etch rate of $SiO_2$, it is preferable that the gas be sprayed so that the incidence angle decreases through gas having a heavy molecular weight, and in order to lower the etch rate of a mask such as a PR, an ACL, etc., it is preferable that the gas be sprayed so that the incidence angle increases through gas having a relatively light molecular weight.

It is preferable that gas for etching a mask such as a PR, an ACL, etc., be sprayed from the first swirl motion SGF 120 that sprays the gas so that the incidence angle thereof becomes greater than that of the second swirl motion SGF 130, and it is preferable that gas for etching $SiO_2$ be sprayed from the second swirl motion SGF 130.

Therefore, the gas sprayed from the second swirl motion SGF 130 may include at least any one of $C_4F_8$, $C_4F_6$, $C_3F_8$, $C_3F_6$, $C_2F_6$, $SF_6$, and $C_3F_6O$, which are gases that etch $SiO_2$, and the gas sprayed from the first swirl motion SGF 120 may include at least any one of $CF_4$, $CHF_3$, Ar, $O_2$, and $N_2$ that etch a PR.

Further, since the gas sprayed from the second swirl motion SGF 130 is gas for improving the etch rate of $SiO_2$ and the gas sprayed from the first swirl motion SGF 120 is gas for lowering the etch rate of a mask such as a PR, an ACL, etc., it is preferable that the gas sprayed from the second swirl motion SGF 130 include gas having a heavier molecular weight than the gas sprayed from the first swirl motion SGF 120.

In addition, since the gas sprayed from the second swirl motion SGF 130 is gas for improving the etch rate of $SiO_2$ and the gas sprayed from the first swirl motion SGF 120 is gas for lowering the etch rate of a mask such as a PR, an ACL, etc., it is preferable that the position where the second swirl motion SGF 130 is installed on the housing 110 be higher than the position where the first swirl motion SGF 120 is installed on the housing 110.

When the second swirl motion SGF 130, which sprays the gas at the downward angle, is installed at a higher position than the first swirl motion SGF 120, the etch rate of $SiO_2$ may be effectively improved so that the etch rate of a mask such as a PR, an ACL, etc., may be lowered.

However, the present invention is not limited thereto, and as necessary, the second swirl motion SGF 130 may be installed at the same height as the first swirl motion SGF 120, or the second swirl motion SGF 130 may be installed at a lower height than the first swirl motion SGF 120.

The plasma chamber having the swirl motion SGF according to the embodiment of the present invention may further include a CGF 140 that is provided above the housing 110 and sprays gas into the housing 110.

In the case in which the gas sprayed into the plasma chamber consists of heavy molecules, when only the CGF is used, there is a problem in that a z-direction (lower direction of the housing) velocity increases due to the heavy molecules, and thus the uniformity of the etch rate is degraded.

Referring to FIG. 2, in the plasma chamber having the swirl motion SGF according to the embodiment of the present invention, the first swirl motion SGF 120 and the second swirl motion SGF 130 may be used together with the CGF 140 and the design of the first swirl motion SGF 120 and the second swirl motion SGF 130 may be adjusted, thereby preventing the uniformity of the etch rate from deteriorating.

According to an embodiment of the present invention, the gas sprayed from the first swirl motion SGF 120 and the second swirl motion SGF 130 may include gas having a heavier molecular weight than the gas sprayed from the CGF 140.

Since the uniformity of the etch rate cannot be improved when the heavy molecule gas is sprayed from the CGF 140, it is preferable that the heavy molecules gas be sprayed through the first swirl motion SGF 120 and the second swirl motion SGF 130.

Specifically, when heavy molecule gas such as $CF_4$, $C_4F_6$, $C_4F_8$, $C_3F_8$, $SF_6$, $C_3F_6$, $C_3F_6O$, etc., is used, the heavy molecules gas such as $CF_4$, $C_4F_6$, $C_4F_8$, $C_3F_8$, $SF_6$, $C_3F_6$, $C_3F_6O$, etc., may be sprayed from the first swirl motion SGF 120 and the second swirl motion SGF 130 to form a downward swirl motion, and accordingly, the uniformity of the etch rate can be improved. According to an embodiment of the present invention, the gas sprayed from the CGF 140 may include at least any one of $O_2$, $N_2$, and Ar.

However, the present invention is not limited thereto, and the gas sprayed from the first swirl motion SGF 120 and the second swirl motion SGF 130 may not be heavier than the gas sprayed from the CGF 140.

The gas sprayed from the first swirl motion SGF 120 and the second swirl motion SGF 130 may also be sprayed from the CGF 140. That is, some of the gas sprayed from the first swirl motion SGF 120 and the second swirl motion SGF 130 may be sprayed while a flow rate thereof is adjusted in the CGF 140.

The plasma chamber having the swirl motion SGF according to the embodiment of the present invention may further include a spray motion SGF 150 that sprays gas into the housing 110.

The spray motion SGF 150 may spray gas toward the surface of the wafer 10 seated on the seating part 111 or upward of the surface of the wafer 10. The spray motion SGF 150 may not spray gas to form a swirl motion, but may spray gas toward the wafer 10.

Figure 6:
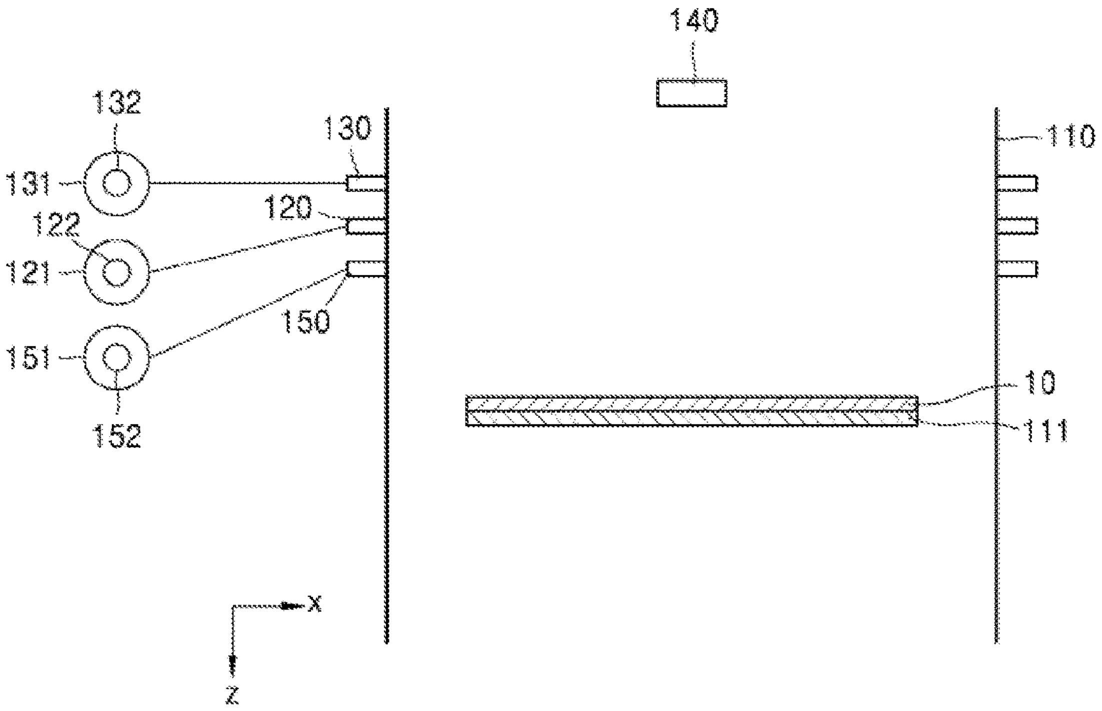
FIG. 6 is a diagram illustrating a housing on which a first swirl motion side gas feed, a second swirl motion side gas feed, a spray motion side gas feed, and a center gas feed are provided according to an embodiment of the present invention.

Referring to FIG. 6, the spray motion SGF 150 may include a nozzle 151 having a nozzle hole 152 through which gas is sprayed, and a plurality of nozzles 151 may be provided in the housing 110.

According to an embodiment of the present invention, the gas sprayed from the spray motion SGF 150 may include gas having a lighter molecular weight than the gas sprayed from the first swirl motion SGF 120 and the second swirl motion SGF 130.

Since the uniformity of the etch rate cannot be improved when heavy molecule gas is sprayed from the spray motion SGF 150, it is preferable that the heavy molecule gas be sprayed using the first swirl motion SGF 120 and the second swirl motion SGF 130.

The gas sprayed from the spray motion SGF 150 may include at least any one of Ar, $O_2$, and $N_2$.

However, the present invention is not limited thereto, and the gas sprayed from the first swirl motion SGF 120 and the second swirl motion SGF 130 may not be heavier than the gas sprayed from the spray motion SGF 150.

The gas sprayed from the first swirl motion SGF 120 and the second swirl motion SGF 130 may also be sprayed from the spray motion SGF 150.

That is, some of the gas sprayed from the first swirl motion SGF 120 and the second swirl motion SGF 130 may be sprayed while a flow rate thereof is adjusted in the spray motion SGF 150.

According to an embodiment of the present invention, the first swirl motion SGF 120, the second swirl motion SGF 130, the CGF 140, and the spray motion SGF 150 may include a flow ratio controller (FRC).

The flow rate and type of the first swirl motion SGF 120, the second swirl motion SGF 130, the CGF 140, and the gas sprayed from the spray motion SGF 150 may be adjusted through the FRC.

According to an embodiment of the present invention, the plurality of first swirl motion SGFs 120 and the plurality of second swirl motion SGFs 130 may be provided at different heights on the housing 110.

Three or more of the plurality of first swirl motion SGFs 120 and the plurality of second swirl motion SGFs 130 may be provided at points spaced a predetermined height from the seating part 111, and three or more of the plurality of first swirl motion SGFs 120 and the plurality of second swirl motion SGFs 130 may be provided at points spaced another predetermined height from the seating part 111.

That is, when the plurality of first swirl motion SGFs 120 and the plurality of second swirl motion SGFs 130 are provided on the housing 110, three or more first swirl motion SGFs 120 form one layer, three or more second swirl motion SGFs 130 form one layer, and thus multiple layers may be formed. (In this case, the first swirl motion SGF 120 and the second swirl motion SGF 130 may be provided at different positions.)

According to an embodiment of the present invention, the lengths of a first nozzle 121 provided in the first swirl motion SGF 120 and a second nozzle 131 provided in the second swirl motion SGF 130 may be changed as necessary. Further, the size, number, and direction of a first nozzle hole 122 provided in the first swirl motion SGF 120 and a second nozzle hole 132 provided in the second swirl motion SGF 130 may be changed as necessary.

According to an embodiment of the present invention, the plasma formed in the reaction space of the housing 110 may include ions and radicals, and the wafer 10 may be etched by a synergistic effect of the ions and the radicals.

According to an embodiment of the present invention, the plasma formed in the reaction space of the housing 110 may include electrons, and the electron energy relaxation length (EERL) of the electrons may be smaller than a diameter of the housing.

In the plasma chamber having the swirl motion SGF according to the embodiment of the present invention, the etching process may be performed in the process area of Local Electron Kinetics. The conventional etching process was performed in the process area of nonlocal electron kinetics, where the EERL is always larger than the diameter of the process chamber.

However, in the plasma chamber having the swirl motion SGF according to the embodiment of the present invention, the etching process may be performed in the process area of Local Electron Kinetics where the EERL is smaller than the diameter (diameter of the housing 110) of the process the chamber.

Accordingly, in the plasma chamber having the swirl motion SGF according to the embodiment of the present invention, the plasma density at the edge of the housing 110 may be higher than that in the center of the housing 110, and the etch rate at the edge of the housing 110 may also be higher than that in the center of the housing 110.

In the conventional etching process, a problem in which etching is weakly performed at the edge of the wafer (low edge yield problem) may occur, and the plasma chamber having the swirl motion SGF according to the embodiment of the present invention may prevent the above problem from occurring by forming the etch rate in the edge of the housing 110 higher than that in the center of the housing 110.

Further, in the conventional etching process, in order to solve the problem of weak etching at the edge of the wafer (low edge yield problem), independent RF power was applied, or a heater or a lift device to prevent corrosion of an edge ring was used.

However, in the plasma chamber having the swirl motion SGF according to the embodiment of the present invention, a separate device may not be used because the etch rate at the edge of the housing 110 is higher than that in the center of the housing 110, and accordingly, there is an advantage of reducing production costs and improving yield.

In the plasma chamber having the swirl motion SGF according to the embodiment of the present invention, the etching process may be performed in the process area of Local Electron Kinetics, and thus the plasma density inside the housing 110 may be increased from the inside of the housing 110 toward the outside of the housing 110.

Accordingly, it is possible to obtain a concave etch rate profile in which the etch rate is low inside the housing 110 and the etch rate increases toward the outside of the housing 110. Through the concave etch rate profile, it is possible to solve the low edge yield problem in which the etch rate decreases at the edge of the housing 110.

However, when heavy molecule gas such as $CF_4$, $C_4F_6$, $C_4F_8$, $C_3F_8$, $SF_6$, $C_3F_6$, $C_3F_6O$, etc., is sprayed only through the CGF 140, the concave etch rate profile may not be obtained. That is, when heavy molecule gas is present and the heavy molecule gas is sprayed from the CGF 140, the process area of Local Electron Kinetics may be invalid.

In the plasma chamber having the swirl motion SGF according to the embodiment of the present invention, in order to solve such a problem, the heavy molecule gas may be sprayed from the first swirl motion SGF 120 and the second swirl motion SGF 130.

According to an embodiment of the present invention, the gas sprayed from the first swirl motion SGF 120 and the second swirl motion SGF 130 may have a heavier molecular weight than the gas sprayed from the CGF 140. Since the uniformity of the etch rate cannot be improved when the heavy molecule gas is sprayed from the CGF 140, it is preferable that the heavy molecule gas be sprayed the first swirl motion SGF 120 and the second swirl motion SGF 130.

Specifically, when heavy molecule gas such as $CF_4$, $C_4F_6$, $C_4F_8$, $C_3F_8$, $SF_6$, $C_3F_6$, $C_3F_6O$, etc., is used, the heavy molecule gas such as $CF_4$, $C_4F_6$, $C_4F_8$, $C_3F_8$, $SF_6$, $C_3F_6$, $C_3F_6O$, etc., may be sprayed from the first swirl motion SGF 120 and the second swirl motion SGF 130 to form a downward swirl motion, and accordingly, the uniformity of the etch rate can be improved.

Here, the gas sprayed from the first swirl motion SGF 120 and the second swirl motion SGF 130 may have a heavier molecular weight than the gas sprayed from the CGF 140, but some of the gas sprayed from the first swirl motion SGF 120 and the second swirl motion SGF 130 may not be heavier than the gas sprayed from the CGF 140 or may be the same gas as the gas sprayed from the CGF 140.

That is, the heavy molecule gas may be sprayed through the first swirl motion SGF 120 and the second swirl motion SGF 130, and general gas, not heavy molecular gas, may be sprayed from all of the first swirl motion SGF 120, the second swirl motion SGF 130, and the CGF 140.

According to an embodiment of the present invention, the gas sprayed from the first swirl motion SGF 120 and the second swirl motion SGF 130 may form a downward swirl motion and may be sprayed onto the wafer 10 within the housing 110.

In this case, the gas sprayed from the first swirl motion SGF 120 and the second swirl motion SGF 130 may rotate in a clockwise or counterclockwise direction to form a downward swirl motion.

Further, the plurality of first swirl motion SGFs 120 and the plurality of second swirl motion SGFs 130 may spray the gas in different directions to form a downward swirl motion.

In the plasma chamber having the swirl motion SGF according to the embodiment of the present invention, the first swirl motion SGF 120 and the second swirl motion SGF 130 are used with an ICP, and the gas sprayed from the first swirl motion SGF 120 and the second swirl motion SGF 130 may form a downward swirl motion.

In the plasma chamber having the swirl motion SGF according to the embodiment of the present invention, in which the gas sprayed from the first swirl motion SGF 120 and the second swirl motion SGF 130 forms a downward swirl motion, metal etching, oxide etching, and poly etching may be applied, and thus the etch rate can be improved.

The plasma chamber having the swirl motion SGF according to the embodiment of the present invention may be used in plasma processes of semiconductors and displays, but the present invention is not limited thereto, and the plasma chamber having the swirl motion SGF according to the embodiment of the present invention may be used in various processes, in which the plasma processes are used, in addition to the plasma processes of semiconductors and displays.

Further, the first swirl motion SGF 120 and the second swirl motion SGF 130, which spray the gas to form a downward swirl motion, may be applied to plasma processes such as plasma deposition, PR stripping, plasma doping, etc.

In the plasma chamber having the swirl motion SGF according to the embodiment of the present invention, by appropriately adjusting the type and flow rate of the gas sprayed from the first swirl motion SGF 120, the second swirl motion SGF 130, the CGF 140, and the spray motion SGF 150, the etch rate may be increased, and at the same time, the uniformity of the etch rate can be improved.

Further, in the plasma chamber having the swirl motion SGF according to the embodiment of the present invention, by appropriately adjusting the type and flow rate of the gas sprayed from the first swirl motion SGF 120, the second swirl motion SGF 130, the CGF 140, and the spray motion SGF 150, it is possible to satisfy a center-low etch rate, a vertical etch profile, and satisfy a high selectivity of a mask such as a PR, an ACL, etc.

In the conventional plasma chamber, the type and flow rate of the gas were appropriately adjusted through a trial and error method, whereas in the plasma chamber having the swirl motion SGF according to the embodiment of the present invention, the design of the first swirl motion SGF 120, the second swirl motion SGF 130, the CGF 140, and the spray motion SGF 150 may be adjusted, and thus the performance of the etching process can be improved.

That is, in the plasma chamber having the swirl motion SGF according to the embodiment of the present invention, the flow rate of the gas may be adjusted while appropriately distributing the gas through the first swirl motion SGF 120, the second swirl motion SGF 130, the CGF 140, and the spray motion SGF 150 according to the characteristics of the gas, and thus the performance of the etching process can be improved.

The plasma chamber having the swirl motion SGF according to the embodiment of the present invention described above has the following effects.

In the plasma chamber having the swirl motion SGF according to the embodiment of the present invention, there is an advantage in that the design of the SGF, which is provided on a side surface of the chamber and sprays gas in the form of a downward swirl motion, is adjusted so that a uniform etch rate can be maintained inside the chamber.

Further, in the plasma chamber having the swirl motion SGF according to the embodiment of the present invention, there is an advantage in that a first swirl motion SGF that sprays gas along a plane extending in a direction parallel to a plane formed by a seating part, and a second swirl motion SGF that sprays gas at an angle formed with respect to the plane extending in the direction parallel to the plane formed by the seating part can be used, and thus an etch rate can be improved and the uniformity of the etch rate can be improved.

In addition, in the plasma chamber having the swirl motion SGF according to the embodiment of the present invention, there is an advantage in that, since heavy molecular gas can be sprayed through the SGFs by simultaneously using a first swirl motion SGF, a second swirl motion SGF, a spray motion SGF, and a CGF, an etch rate can be improved and the uniformity of the etch rate can be improved.

While the present invention has been described with reference to embodiments illustrated in the accompanying drawings, the embodiments should be considered in a descriptive sense only, and it should be understood by those skilled in the art that various alterations and equivalent other embodiments may be made. Therefore, the technical scope of the inventive concept will be defined by the scope of the appended claims.

The invention claimed is:

1. A plasma chamber provided with a swirl motion side gas feed, which is a plasma chamber in which plasma is formed to etch a wafer, the plasma chamber comprising:

a housing having a seating part on which the wafer is seated;

a first swirl motion side gas feed provided on a side surface of the housing and configured to spray gas into the housing; and a second swirl motion side gas feed provided on the side surface of the housing and configured to spray gas into the housing, wherein the first swirl motion side gas feed and the second swirl motion side gas feed spray gas along a wall surface of the housing, the first swirl motion side gas feed sprays a gas along a plane extending in a direction parallel to a plane formed by the seating part, and the second swirl motion side gas feed sprays a gas at an angle formed with respect to the plane extending in the direction parallel to the plane formed by the seating part.

2. The plasma chamber of claim 1, wherein the gases sprayed from the first swirl motion side gas feed and the second swirl motion side gas feed form a downward swirl motion and are sprayed onto the wafer within the housing.

3. The plasma chamber of claim 1, wherein the plane extending in the direction parallel to the plane formed by the seating part is formed at a position at where the second swirl motion side gas feed is provided on the housing, and a velocity ($v_o$) of the gas sprayed from the second swirl motion side gas feed is $v_o=(0, v_\theta, v_z)$ ($v_z \neq 0$) with respect to a cylindrical coordinate system (r, θ, z) whose origin is a point at which the plane and a center line of the housing meet.

4. The plasma chamber of claim 3, wherein the plane extending in the direction parallel to the plane formed by the seating part is formed at a position where the first swirl motion side gas feed is provided on the housing, and a velocity ($v_o$) of the gas sprayed from the first swirl motion side gas feed is $v_o=(0, v_\theta, 0)$ with respect to the cylindrical coordinate system (r, θ, z) whose origin is a point at which the plane and the center line of the housing meet.

5. The plasma chamber of claim 1, wherein the gases sprayed from the first swirl motion side gas feed and the second swirl motion side gas feed include at least any one of fluorocarbon ($C_xF_y$)-based gas, fluorohydrocarbon ($C_xH_yF_z$)-based gas, $SF_6$, $C_3F_6O$, Ar, $O_2$, and $N_2$.

6. The plasma chamber of claim 1, wherein the gas sprayed from the second swirl motion side gas feed includes gas having a heavier molecular weight than the gas sprayed from the first swirl motion side gas feed.

7. The plasma chamber of claim 1, wherein a position where the second swirl motion side gas feed is installed on the housing is higher than a position where the first swirl motion side gas feed is installed on the housing.

8. The plasma chamber of claim 1, wherein the gas sprayed from the second swirl motion side gas feed includes at least any one of $C_4F_8$, $C_4F_6$, $C_3F_8$, $C_3F_6$, $C_2F_6$, $SF_6$, and $C_3F_6O$, and the gas sprayed from the first swirl motion side gas feed includes at least any one of $CF_4$, $CHF_3$, Ar, $O_2$, and $N_2$.

9. The plasma chamber of claim 1, further comprising a center gas feed provided above the housing and configured to spray gas into the housing, wherein the gases sprayed from the first swirl motion side gas feed and the second swirl motion side gas feed include gas having a heavier molecular weight than gas sprayed from the center gas feed.

10. The plasma chamber of claim 9, wherein the gas sprayed from the center gas feed includes at least any one of $O_2$, $N_2$, and Ar.

11. The plasma chamber of claim 1, further comprising a spray motion side gas feed configured to spray gas into the housing, wherein the spray motion side gas feed sprays a gas toward a surface of the wafer seated on the seating part or upward of the surface of the wafer.

12. The plasma chamber of claim 11, wherein the gas sprayed from the spray motion side gas feed includes gas having a heavier molecular weight than the gases sprayed from the first swirl motion side gas feed and the second swirl motion side gas feed.

13. The plasma chamber of claim 12, wherein the gas sprayed from the spray motion side gas feed includes at least any one of Ar, $O_2$, and $N_2$.

14. The plasma chamber of claim 1, wherein:

the first swirl motion side gas feed is provided as a plurality of first swirl motion side gas feeds on the housing, and the second swirl motion side gas feed is provided as a plurality of second swirl motion side gas feeds on the housing;

three or more of the plurality of first swirl motion side gas feeds provided on the housing are provided at the same height from the seating part; and three or more of the plurality of second swirl motion side gas feeds provided on the housing are provided at the same height from the seating part.

15. The plasma chamber of claim 1, wherein:

the plasma formed in an internal space of the housing includes ions and radicals; and the wafer is etched by a synergistic effect of the ions and the radicals.

* * * * *